United States Patent
Muchherla et al.

(10) Patent No.: US 9,431,121 B2
(45) Date of Patent: Aug. 30, 2016

(54) READ VOLTAGE ADJUSTMENT

(71) Applicant: Micron Technology, Inc., Boise, ID (US)

(72) Inventors: Kishore K. Muchherla, San Jose, CA (US); Sampath K. Ratnam, Boise, ID (US); Asheesh Kwatra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/686,100

(22) Filed: Apr. 14, 2015

(65) Prior Publication Data

US 2016/0118129 A1    Apr. 28, 2016

Related U.S. Application Data

(60) Provisional application No. 62/068,306, filed on Oct. 24, 2014.

(51) Int. Cl.
    *G11C 16/26* (2006.01)
    *G11C 16/10* (2006.01)
    *G11C 16/04* (2006.01)

(52) U.S. Cl.
    CPC ........... *G11C 16/26* (2013.01); *G11C 16/0466* (2013.01); *G11C 16/10* (2013.01)

(58) Field of Classification Search
    CPC ..................................................... G11C 16/26
    USPC ..................................................... 365/185.21
    See application file for complete search history.

(56) References Cited

U.S. PATENT DOCUMENTS

| 8,966,343 | B2 | 2/2015 | Syu et al. | |
|---|---|---|---|---|
| 2003/0193825 | A1* | 10/2003 | Nagasue | G11C 27/005 365/185.03 |
| 2011/0205805 | A1* | 8/2011 | Honma | G11C 11/5628 365/185.22 |
| 2011/0242900 | A1 | 10/2011 | Hoei | |
| 2012/0002482 | A1 | 1/2012 | Franklin et al. | |
| 2012/0063227 | A1* | 3/2012 | Weingarten | G11C 11/5628 365/185.09 |
| 2012/0294104 | A1* | 11/2012 | Mun | G11C 11/56 365/218 |
| 2013/0235662 | A1* | 9/2013 | Fujiu | G11C 16/3459 365/185.03 |
| 2014/0036589 | A1 | 2/2014 | Parthasarathy et al. | |
| 2014/0369128 | A1* | 12/2014 | Choi | G11C 16/26 365/185.17 |

(Continued)

OTHER PUBLICATIONS

U.S. Appl. No. 14/644,365, entitled "Temperature Related Error Management", filed Mar. 11, 2015, 37 pp.

* cited by examiner

*Primary Examiner* — Son Mai (74) *Attorney, Agent, or Firm* — Brooks, Cameron & Huebsch, PLLC (57) ABSTRACT

The present disclosure includes apparatuses and methods related to adjusting read voltages of charge-trapping flash memory. An example embodiment apparatus can include a memory array and a controller coupled to the memory array. The controller is configured to adjust a read voltage used to access a portion of the memory array based on a length of time since a last WRITE operation to the portion.

42 Claims, 5 Drawing Sheets

(56) References Cited

U.S. PATENT DOCUMENTS

| | | | | |
|---|---|---|---|---|
| 2015/0261467 A1* | 9/2015 | Seo | ............... | G06F 11/1068 714/758 |
| 2015/0262697 A1* | 9/2015 | Kim | ............... | G11C 16/32 711/103 |
| 2015/0332772 A1* | 11/2015 | Kim | ............... | G11C 16/10 365/185.22 |
| 2015/0332780 A1* | 11/2015 | Jang | ............... | G11C 16/32 365/185.18 |
| 2015/0340099 A1* | 11/2015 | Kwak | ............... | G11C 16/34 711/103 |
| 2015/0357043 A1* | 12/2015 | Im | ............... | G11C 16/349 365/185.11 |
| 2015/0370493 A1* | 12/2015 | Choi | ............... | G06F 3/0619 711/103 |
| 2015/0370629 A1* | 12/2015 | Song | ............... | G06F 11/1016 714/721 |
| 2016/0004437 A1* | 1/2016 | Kim | ............... | G06F 3/061 714/764 |
| 2016/0034349 A1* | 2/2016 | Choi | ............... | G11C 29/52 714/764 |

READ VOLTAGE ADJUSTMENT

PRIORITY INFORMATION

This application claims benefit of priority under 35 U.S.C. 119(e) to U.S. Provisional Application Ser. No. 62/068,306, filed Oct. 24, 2014, the specification of which is incorporated herein by reference.

TECHNICAL FIELD

The present disclosure relates generally to semiconductor memory and methods, and more particularly, to adjusting read voltages of charge-trapping flash memory.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error data, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

Charge-trapping flash memory (CTF) is a semiconductor memory technology used for NAND flash memory and NOR flash memory. In contrast to floating-gate MOSFET technology, CTF uses a planar floating gate to trap electrons rather than storing electrons in a doped polycrystalline silicon floating gate structure. For example, a silicon nitride film can be used to trap electrons. CTF memory can provide several advantages over memory using floating gate structures including fewer processing steps to manufacture, smaller geometries (reducing chip size and cost), multiple bits can be stored in a single flash memory cell, improved reliability, and higher manufacturing yield since CTF is less susceptible to point defects in the tunnel oxide layer.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

As memory devices are scaled to smaller sizes, an available read window between different programmed states for a memory cell may shrink making the memory devices more susceptible to read errors. To address possible read errors associated therewith, some memory devices may benefit from improved read and/or error prevention techniques.

DETAILED DESCRIPTION

The present disclosure includes apparatuses and methods related to adjusting read voltages of charge-trapping flash memory. An example embodiment apparatus can include a memory array and a controller coupled to the memory array. The controller is configured to adjust a read voltage used to access a portion of the memory array based on a length of time since a last WRITE operation to the portion.

Charge-trapping flash (CTF) memory cells can experience changing read voltage thresholds (Vt) of programmed states over time after programming due to charge settling. The charge of a recently-programmed memory cell settles over time to a steady state read voltage threshold, for example, within several milliseconds after the memory cell is programmed. A recently-programmed memory cell can be a memory cell programmed within length of time, such as within a predetermined time period. According to some embodiments of the present disclosure, a length of time can be measured using a proxy for duration such whether a page was last programmed within a number of pages of the last written page. While page is used herein to denote a particular portion of memory to which a memory cell is associated, embodiments of the present disclosure can be applied to other groups and/or identifier of memory cells such as a block, plane, row, column, address, or other physical or logical delineation of a portion of memory being read with respect to a last written portion of memory.

Considering that a non-zero period of time is used in programming a page of memory cells, it follows that if a particular page is within a number of pages of the last written page (e.g., a predetermined number of pages of the last written page), at least a minimum length of time to program that number of pages has not occurred since the particular page was programmed. Conversely, if a particular page is not within the number of pages of the last written page, at least a minimum length of time to program that number of pages has occurred since the particular page was programmed. The length of time and/or the corresponding number of pages since the last written page serving as a proxy for direct time measurement, can be selected to be the minimum time necessary for memory cell charge to settle to a steady state after programming.

Charge settling can result in transitory changes in read voltage thresholds immediately after programming. CTF NAND memory cells with a planar floating gate, for example, can experience an increased Vt after the charge in the floating gate settles down. This is referred to as Quick Charge Gain (QCG). Steady state, as used herein, is not limited to a charge state involving zero change in charge, but rather refers to an equilibrium condition of memory cell charge that occurs as the effects of transients (e.g., QCG) are no longer important in in programming and/or reading a programmed state of the memory cell. The charge of the memory cell may still be changing; however, the change is within a sufficiently small range so as not to have a discernable impact on reading the memory cell charge over time. For example, the memory cell charge may be asymptotically approaching a limit condition and can reach a steady state when the charge is within a predetermined range around the limit condition and/or the change in charge over time is less than a predetermined rate.

If the increased Vt is not factored in a Read Window Budget, a read operation in a block after a memory cell has reached steady state can have a higher raw bit error rate (RBER). One way of addressing this phenomena is by factoring in the QCG in the Read Window Budget. The Vt of the page is deliberately placed at a lower voltage and once the steady state has been attained, the Vt increases to achieve the desired Read Window Budget margins.

However, if a read operation is performed soon after programming, before the memory cells have reached a steady state charge, ignoring the transient changes occurring with respect to Vt can result in increased read errors. Performing an immediate read verification of programmed data can involve performing read operations before charge settling has occurred to the steady state. The Vt verified during programming may not be the same Vt for steady state conditions.

That is, if the host attempts to immediately verify the data after programming (e.g., before charge settles to a steady state), the Vt appears to be a lesser voltage. Therefore, performing program verify operations before charge settles to the steady state, may result in a greater RBER that from apparently uncorrectable errors, frequent (and unnecessary) data refreshes that not only hurt performance but also increase write amplification, and may result in generally poor memory performance as data is constantly moved from one block to another, which ages the memory at a faster rate. Depending on the trigger rates, the memory could exceed an endurance specification within a drive time-between-write (TBW) specification.

Uncorrectable error correcting code (ECC) events can result in apparatus performance degradation. Uncorrectable ECC events in the early life of a drive can be perceived as defects so that blocks of memory may be retired prematurely and unnecessarily if the block management policy is not managed correctly (e.g., to account for transient Vt distributions after programming charge-trapping flash memory cells). For example, a drive may enter write protect for extensive program immediate read testing.

According to various embodiments of the present disclosure, read voltage can be adjusted to account for the changes in Vt over time after programming. For example, read voltage can be adjusted based on a time difference between a write operation and a read operation. Alternatively, read voltage can be adjusted based on proximity of a page being read to a record of last written page. For example, a read voltage offset that decreases read voltage can be used if the page being read is within a number of pages of the last written page.

Firmware can be used to consistently track the last written page on a drive and if the host attempts to access data on a page which is yet to stabilize, the firmware can add an offset to the read voltage before issuing the read command to the memory. In this manner, real time performance of the drive does not suffer due to the initially lower threshold voltages prior to, and during, charge settling.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 107 may reference element "07" in FIG. 1, and a similar element may be referenced as 207 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1:
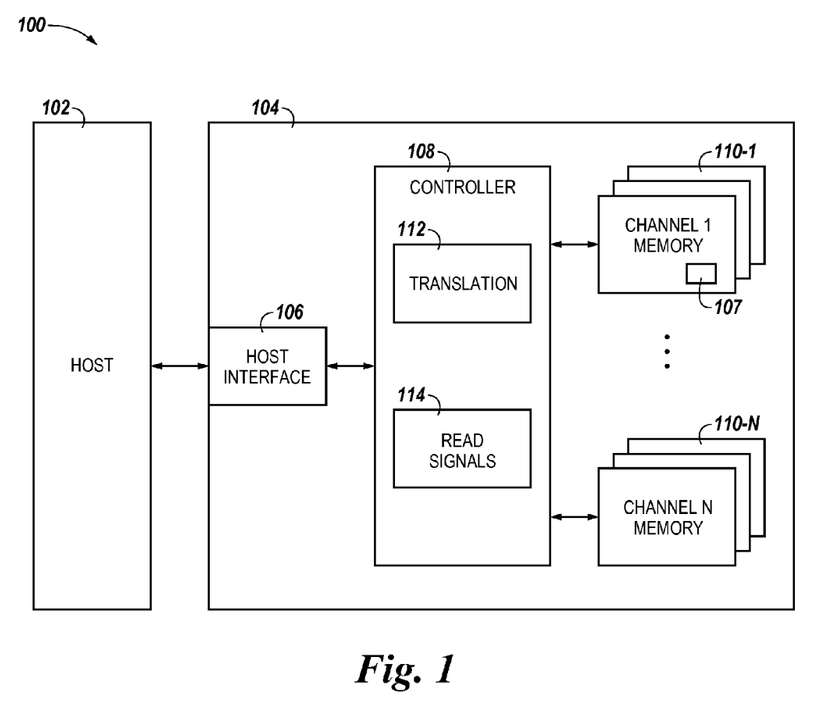
FIG. 1 is a block diagram of an apparatus in the form of a computing system including at least one memory system in accordance with a number of embodiments of the present disclosure.

FIG. 1 is a block diagram of an apparatus in the form of a computing system 100 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110-1, . . . , 110-N (e.g., solid state memory devices such as charge-trapping NAND flash devices), which provide a storage volume for the memory system 104. The memory system 104 can be a single memory device.

As illustrated in FIG. 1, the controller 108 can be coupled to the host interface 106 and to the memory devices 110-1, . . . , 110-N via a plurality of channels and can be used to send data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., having an on-die controller).

The controller 108 can communicate with the memory devices 110-1, . . . , 110-N to control data read, write, and erase operations, among other operations. The memory devices 110-1, . . . , 110-N can include a plurality of memory arrays 107 on a single die, a plurality of memory arrays 107 on multiple dies, or a single memory array 107 on a single die. The controller 108 can be on the same die or a different die than any or all of the memory devices 110-1, . . . , 110-N.

The memory arrays can be charge-trapping flash memory arrays 107 with a NAND architecture or a NOR architecture, for example. However, embodiments are not limited to a particular memory array composition, arrangement, or architecture. Although charge-trapping flash memory cells in a NAND architecture are generally referred to herein, embodiments are not so limited. Other examples include other type memory cells subject to charge settling and/or charge-trapping flash memory cells in a NAND architecture, etc. Embodiments are also not limited to a memory cells formed using particular materials, such as silicon nitride charge-trapping flash memory cells. Memory cells fabricated using other materials or charge trapping structures that exhibit transient charge settling characteristics may also benefit from the apparatuses and methods described herein.

Although not specifically illustrated, in some embodiments, the controller 108 can include a discrete memory channel controller for each channel coupling the controller 108 to the memory devices 110-1, . . . , 110-N. The controller 108 can include, for example, a number of components in the form of hardware and/or firmware (e.g., a number of integrated circuits) and/or software for controlling access to the memory devices 110-1, . . . , 110-N and/or for facilitating data transfer between the host 102 and memory devices 110-1, . . . , 110-N.

The number of memory devices 110-1, . . . , 110-N can include a number of arrays 107 of memory cells (e.g., non-volatile memory cells). The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from memory (e.g., memory devices 110-1, . . . , 110-N of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

According to various embodiments of the present disclosure, the controller 108 can track a time (e.g., via a time stamp) of each read operation and compare it with a time of a last write operation to a particular portion of a memory array 107. If the time period is within a charge settling time for the memory array 107 or memory devices 110-1, . . . , 110-N, the read voltage can be adjusted, such as by addition of an offset (e.g., compensating voltage that reduces the read voltage from a read voltage used charge has increased to a steady state level). QGC can become more prominent (e.g., to increase Vt) after a few seconds. According to some embodiments of the present disclosure, the read voltage can be adjusted (such as by application of an offset to lower Vt) in the range of a few mS.

As illustrated in FIG. 1, the controller 108 can include logical-to-physical translation circuitry 112 and read signal circuitry 114. Each of the logical-to-physical translation circuitry 112 and read signal circuitry 114 can be discrete components such as an application specific integrated circuit (ASIC) or the components may reflect functionally provided by circuitry and/or executable instructions within the controller 108 that does not necessarily have a discrete physical form separate from other portions of the controller 108. Although illustrated as components within the controller 108 in FIG. 1, each of the logical-to-physical translation circuitry 112 and read signal circuitry 114 can be external to the controller 108 or have a number of components located within the controller 108 and a number of components located external to the controller 108. The functionality described herein as being implemented by the controller 108 (e.g., by the logical-to-physical translation circuitry 112 and/or the read signal circuitry 114) can be provided as a non-transitory electronic device readable medium storing instructions executable by the electronic device (e.g., firmware in the controller 108) to provide the functionality.

The logical-to-physical translation circuitry 112 can be used to convert between host and/or file system addresses and memory addresses. In some embodiments, the logical-to-physical translation circuitry 112 can include a flash translation layer (FTL). The logical-to-physical translation circuitry 112 can be used (e.g., during a programming operation performed on the memory devices 110-1, . . . , 110-N) to map a logical address associated with a data entry to a physical address in the memory devices 110-1, . . . , 110-N. The logical-to-physical translation circuitry 112 may include an address mapping table in the local memory of the controller 108 to perform the mapping operation. A host 102 can use logical block addresses (LBAs) when addressing a memory system 104. The logical-to-physical translation circuitry 112 can translate an LBA to a physical location in the memory devices 110-1, . . . , 110-N, and vice versa. This allows the host 102 to ignore the physical characteristics of the memory devices 110-1, . . . , 110-N and treat the memory system 104 as a contiguous linear map of logical sectors. Each host operation can be translated into a single or multi-sector memory operation.

The host 102 can access data on the memory system 104 using a linear mapping of sectors translated by the logical-to-physical translation circuitry 112. One LBA can be used to address one sector of data from the host 102. Although sectors may be any size, some examples of standard sector sizes include 512, 520, 528, and 4096 bytes. The logical-to-physical translation circuitry 112 can use a logical page number (LPN) as an abstraction to manage sectors on the memory system 104.

Based on the LBA size and the LPN size, one or multiple LBA can map logically to one LPN. LPNs can be used to define a linear mapping of data onto the physical pages of the memory devices 110-1, . . . , 110-N. For example, one, two, or four LPNs, among other numbers of LPNs can map to one physical page. A physical block number (PBN) can specify the actual location of the data within the memory devices 110-1, . . . , 110-N. The PBN can include a specific channel, chip enable, logical unit number, plane, block, page, position, and an indication of status. A virtual page number (VPN) can specify the logical address of data, but instead of user data, it maps to a location in a table entry in the address mapping table used by the logical-to-physical translation circuitry 112. A VPN can be thought of as an LPN for table entries. The logical-to-physical translation circuitry 112 can track a last written page. The last written page can be identified, for example, by a block and page number. In some embodiments, the logical-to-physical translation circuitry 112 can store the last written page information in the table.

The logical-to-physical translation circuitry 112 can receive a read request including a logical address (e.g., an LBA). The logical-to-physical translation circuitry 112 can correspond to a flash translation layer (FTL) and can translate the logical address to a physical address (e.g., block and page number) and simultaneously determine whether the physical address is in a particular portion of the memory (e.g., a particular block). According to a number of embodiments of the present disclosure, the logical-to-physical translation circuitry 112 can compare the physical address to the last written page to determine whether a physical address is within a threshold number of pages (or other memory divisions such as physical addresses) from a last written page. Such determinations can be made by the logical-to-physical translation circuitry 112 (e.g., as part of the address translation process) before a read request is sent from the logical-to-physical translation circuitry 112 and/or before a read command corresponding to the read request is issued to the memory devices 110-1, . . . , 110-N and/or pages of memory stored thereon.

In response to a physical address being within a threshold number of pages from a last written page, the read signal circuitry 114 can adjust a read voltage (e.g., read signal level such as a default read signal level) based on the proximity of a physical address to be read to the last written page. For example, the read signal circuitry 114 can adjust the read signal level using an offset (e.g., voltage) in response to the physical address being within a threshold number of pages (or physical addresses) from the last written page. According to some embodiments, the threshold number of pages from the last written page can be less than or equal to 10 pages, for example. However, embodiments are not limited to this threshold number of pages, and more or fewer pages may be appropriate corresponding to a particular charge settling time of the charge-trapping flash memory cells, write speeds, and other factors.

The read signal circuitry 114 can adjust the read signal level before a read command corresponding to the read request is issued to the memory devices 110-1, . . . , 110-N. Comparing the physical address on which a read operation is to be executed for proximity to the last written pages can avoid having to record and store time stamp information for write and read operations for each respective memory location since physical address proximity to last written page serves as a proxy for time measurement.

According to some embodiments, the threshold number of pages (or physical addresses) from the last written page can be set such that the time to write to that number of pages corresponds to (e.g., within a range) the time during which charge settling occurs. Pages beyond the threshold number of pages (or physical addresses) from the last written page would have been written to a sufficient time ago that charge settling has occurred to a steady state (e.g., Vt has increased by the QCG).

According to various embodiments, the offset by which the read voltage can be adjusted (e.g., when the page to be written to is within the threshold number of pages from the last written page) can be a pre-characterized fixed value, or can be characterized according to a portion of memory dynamically. For example, the offset can be characterized per logical unit number (LUN), which is a number used to identify a logical unit such as a, which is a device that supports read/write operations and/or is addressed by the small computer system interface (SCSI) protocol or protocols which encapsulate SCSI, for example.

According to a number of embodiments, the offset can be pre-characterized such that the offsets will not result in significant raw error bit rate (RBER) degradation even if the offset is used to adjust read voltages for memory cells that have charge which has settled to a steady state level. According to some embodiments, the offset can be non-zero, e.g., in the range to a few hundreds of mV.

According to various embodiments, an offset can be characterized or pre-characterized based on a page characteristic. For example, an offset can be characterized or pre-characterized based on upper or lower page characteristics, and/or even or odd page characteristics. A same offset can be utilized uniformly across all page write/read combinations, or a customized offset can be utilized for particular write/read combinations. For example, a 0 mV offset can be used for a lower page write with a lower page read (both even and odd), and a non-zero offset can be used for an upper page write with a lower page read (both even and odd).

In some embodiments, the read signal circuitry 114 can adjust the read signal level such that subsequent read requests for the physical address are read using the adjusted read signal level. For example, the read signal circuitry 114 can store the adjusted read signal level for subsequent reads until a number of subsequent pages in the block are programmed (e.g., until the block is fully programmed). A previous read signal level can be restored for the physical address in response to the block subsequently being fully programmed and/or in response to a number of additional physical pages (e.g., a next physical page) within the block being subsequently programmed. In response to receiving a physical address not corresponding to within a number of pages from the last written page in a block, the read signal circuitry 114 can use a default read voltage.

The logical-to-physical translation circuitry 112 can receive a read request including a logical address. The logical-to-physical translation circuitry 112 can translate the logical address to a physical address and simultaneously determine whether the physical address corresponds to a last written page in a block of memory cells. The read signal circuitry 114 can use a default read signal level in response to the physical address not corresponding to the last written page in the block of memory cells. The read signal circuitry 114 can use an adjusted read voltage in response to the physical address corresponding to the last written page in the block of memory cells.

Read requests can originate from the host 102 and/or from the memory system 104, among other originations (e.g., from a direct memory access (DMA) device). For example, a read request can originate from the memory system 104 as part of a wear leveling operation. The memory system 104 can implement wear leveling (e.g., garbage collection and/or reclamation) to control the wear rate on the memory devices 110-1, . . . , 110-N.

Figure 2:
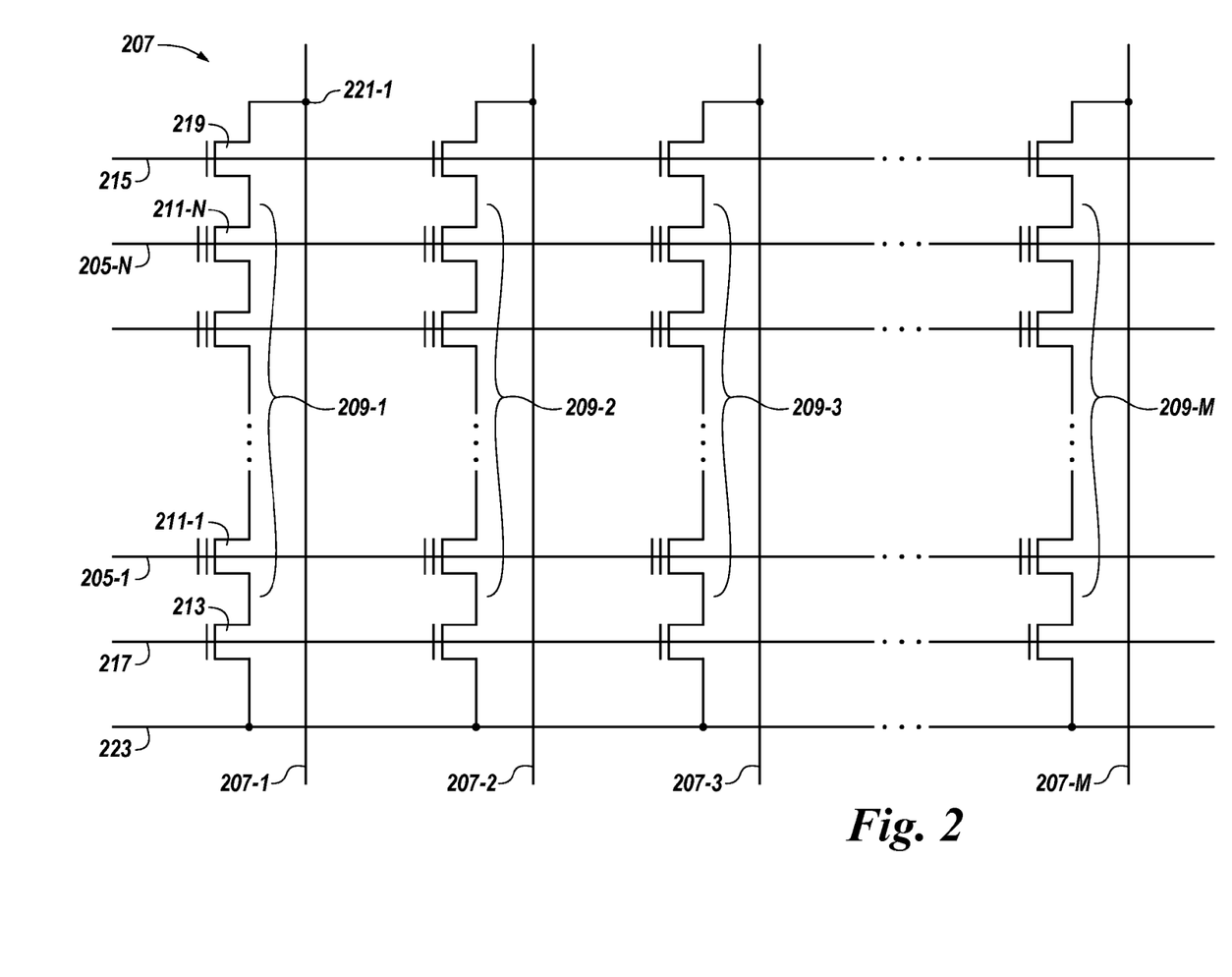
FIG. 2 illustrates a schematic diagram of a portion of a non-volatile memory array in accordance with a number of embodiments of the present disclosure.

FIG. 2 illustrates a schematic diagram of a portion of a non-volatile memory array in accordance with a number of embodiments of the present disclosure. The memory array can be contained within the memory devices 110-1, . . . , 110-N illustrated in FIG. 1. The embodiment of FIG. 2 illustrates a NAND architecture non-volatile memory array. However, embodiments described herein are not limited to this example. As shown in FIG. 2, the memory array 201 includes access lines (e.g., word lines 205-1, . . . , 205-N) and intersecting data lines (e.g., local bit lines 207-1, 207-2, 207-3, . . . , 207-M). For ease of addressing in the digital environment, the number of word lines 205-1, . . . , 205-N and the number of local bit lines 207-1, 207-2, 207-3, . . . , 207-M can be some power of two (e.g., 256 word lines by 4,096 bit lines).

Memory array 201 includes NAND strings 209-1, 209-2, 209-3, . . . , 209-M. Each NAND string includes non-volatile memory cells 211-1, . . . , 211-N, each communicatively coupled to a respective word line 205-1, . . . , 205-N. Each NAND string (and its constituent memory cells) is also associated with a local bit line 207-1, 207-2, 207-3, . . . , 207-M. The memory cells 211-1, . . . , 211-N of each NAND string 209-1, 209-2, 209-3, . . . , 209-M are coupled in series source to drain between a source select gate (SGS) (e.g., a field-effect transistor (FET) 213) and a drain select gate (SGD) (e.g., FET 219). Each source select gate 213 is configured to selectively couple a respective NAND string to a common source 223 responsive to a signal on source select line 217, while each drain select gate 219 is configured to selectively couple a respective NAND string to a respective bit line responsive to a signal on drain select line 215.

As shown in the embodiment illustrated in FIG. 2, a source of source select gate 213 is coupled to a common source line 223. The drain of source select gate 213 is coupled to the source of the memory cell 211-1 of the corresponding NAND string 209-1. The drain of drain select gate 219 is coupled to bit line 207-1 of the corresponding NAND string 209-1 at drain contact 221-1. The source of drain select gate 219 is coupled to the drain of the last memory cell 211-N (e.g., a floating-gate transistor) of the corresponding NAND string 209-1.

In a number of embodiments, construction of the non-volatile memory cells 211-1, . . . , 211-N includes a source, a drain, a floating gate or other charge storage structure, and a control gate. The memory cells 211-1, . . . , 211-N have their control gates coupled to a word line, 205-1, . . . , 205-N, respectively. A NOR array architecture would be similarly laid out, except that the string of memory cells would be coupled in parallel between the select gates. Furthermore, a NOR architecture can provide for random access to the memory cells in the array (e.g., as opposed to page-based access as with a NAND architecture).

A number (e.g., a subset or all) of cells coupled to a selected word line (e.g., 205-1, . . . , 205-N) can be written and/or read together as a group. A number of cells written and/or read together can correspond to a page of data. As used herein, examples of high-level operations are referred to as writing or reading operations (e.g., from the perspective of a controller), whereas, with respect to the memory cells, such operations are referred to as programming or sensing. A group of cells coupled to a particular word line and programmed together to respective states can be referred to as a target page. A programming operation can include applying a number of program pulses (e.g., 16V-20V) to a selected word line in order to increase the threshold voltage (Vt) of selected cells coupled to that selected word line to a desired program voltage level corresponding to a targeted state.

Read operations can include sensing a voltage and/or current change of a bit line coupled to a selected cell in order to determine the state of the selected cell. The read operation can include precharging a bit line and sensing the discharge when a selected cell begins to conduct. Two different types of read operations are described herein (e.g., those using a ramping read signal versus using a plurality of discrete read signals).

Sensing the state of a selected cell can include providing a ramping read signal (e.g., −2V to +3V) to a selected word line, while providing a signal (e.g., a pass voltage such as 4.5V) to word lines coupled to the unselected cells of the string sufficient to place the unselected cells in a conducting state independent of the charge stored on the unselected cells. Alternatively, sensing the state of a selected cell could include applying discrete read signal levels (e.g., −0.05V, 0.5V, and 2V) to a selected word line, and thus to the control gate of a selected cell. The bit line corresponding to the selected cell being read and/or verified can be sensed to determine whether or not the selected cell conducts in response to the particular read signal applied to the selected word line. For example, the state of a selected cell can be determined by the word line voltage at which the bit line current reaches a particular reference current associated with a particular state.

According to a number of embodiments of the present disclosure, a read signal level can be adjusted based on the proximity of a physical address associated with a read request to a last written page (e.g., in the block). A last written page can be a page written to a word line 205-1, . . . , 205-N or a portion thereof. A read signal level can be further adjusted based on the proximity of a physical address associated with a read request to an edge of the block. In addition to any effects that may affect threshold levels for memory cells, such effects may be perturbed near an edge of a block of memory cells due to interference from components such as a source, source select line, drain select line, etc. as well as complications in fabrication of the memory array 201 near the edge of the block.

Figure 3:
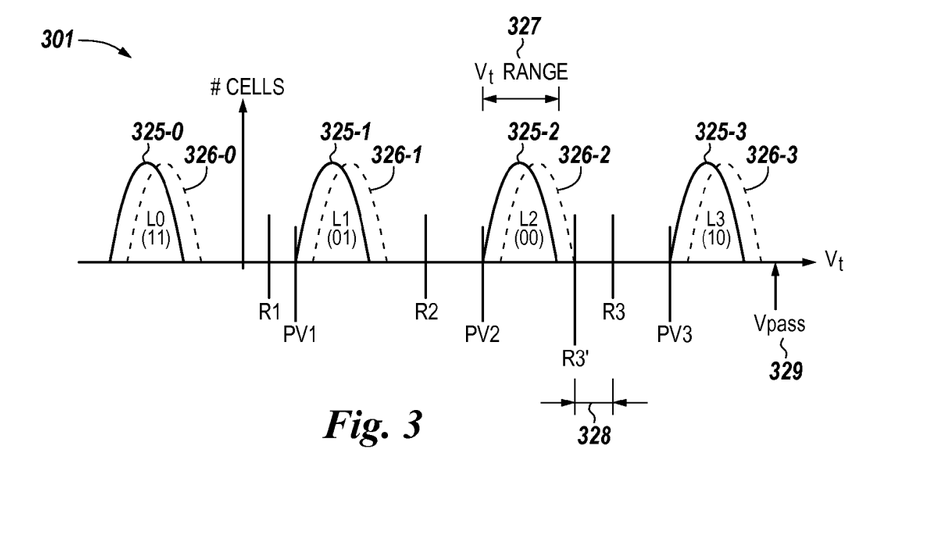
FIG. 3 illustrates a diagram of a change in read voltage threshold distributions for programmed states based on a length of time after programming in accordance with a number of embodiments of the present disclosure.

FIG. 3 illustrates a diagram 301 of a change in read voltage threshold distributions for programmed states based on a length of time after programming in accordance with a number of embodiments of the present disclosure. The example shown in FIG. 3 can represent, for example, memory cells 110-1, . . . , 110-N previously described in connection with FIG. 1. The example shown in FIG. 3 represents two-bit, e.g., four-state, memory cells. However, embodiments of the present disclosure are not limited to this example of two-bit memory cells.

FIG. 3 shows threshold voltage (Vt) distributions that represent four target states, e.g., L0, L1, L2, and L3, respectively, to which the memory cells can be programmed. Threshold voltage (Vt) distributions 325-0, 325-1, 325-2, and 325-3 (shown in FIG. 3 using solid lines) correspond to each of the four initial target states at t=0 (e.g., immediately after programming) before charge settling occurs. Threshold voltage (Vt) distributions 326-0, 326-1, 326-2, and 326-3 (shown in FIG. 3 using dotted lines) correspond to each of the four steady state target states at t=1 mS after charge settling, which shifts the threshold voltage (Vt) distributions to increased voltage levels due to QCG.

In operation, the memory cells in a selected block can be erased together such that they have a Vt level within Vt distribution 326-0 prior to being programmed. As such, distribution 326-0 can be referred to as an erased state and can represent a particular stored data state (target state L0), e.g., stored data such as binary "11". Target state L1 can correspond to data 01, target state L2 can correspond to data 00, and target state L3 can correspond to data 10.

Vt distributions 326-0, 326-1, 326-2, and 326-3 can represent a number of memory cells that are programmed to the corresponding target states, where the height of a Vt distribution curve indicates a number of cells programmed to a particular voltage within the Vt distribution, on average. The range 327 of the Vt distribution curve indicates the range of voltages that represent a particular target state, e.g., the range of the Vt distribution curve 325-2 for L2 represents the range of voltages that correspond to data 00.

A number of sensing voltages are illustrated in FIG. 3. Such sensing voltages can include initial (e.g., transitory) program verify voltages, default read voltage (as indicated without prime designations) and modified read voltages (as indicated by the prime designations).

A program verify operation can be performed after one or more programming pulses to help determine whether a memory cell has been programmed within a desired Vt range to help prevent the memory cell from receiving further programming pulses, e.g., "over programming" the cell. For instance, memory cells to be programmed to the L1 target state can be program verified with a voltage PV1 (e.g., used to read a memory cell to verify the target state has indeed been programmed). Similarly, program verify voltage PV2 can be used with cells to verify they have been programmed to L2 and PV3 can be used with cells to verify they have been programmed to L3.

A program verify operation happens while programming data. A program verify operation can occur before a memory cell charge settles, or after charge settles to a steady state charge. The program verify voltage can be set at a lower voltage than necessary before the charge settle under the assumption that the data will not be read from until the charge settles before any Read operation is performed. According to various embodiments of the present disclosure, a read operation that occurs before a memory cell charge settles can use adjusted read voltages (e.g., that include an offset) to correspond to the lower Vt distributions before QCG effects, a read operation that occurs after a memory cell charge settles to steady state can use default read voltages (e.g., that do not include an offset) to correspond to the higher Vt distributions after QCG effects.

In the example illustrated in FIG. 3, voltage levels R1, R2, and R3 represent sensing voltages, e.g., read voltages, that can be used to distinguish between states L0, L1, L2, and L3 during a sensing operation. In a sensing operation performed on a selected memory cell in a NAND string, the unselected memory cells of the string can be biased with a pass voltage "Vpass" 329 so as to be in a conducting state.

FIG. 3 also shows a read voltage R3', which can be a modified (e.g., reduced) read voltage from the default read voltage (e.g., R3). The default read voltage can be the voltage used to perform a read operation when the charge is in a steady state, and a modified read voltage can be the voltage that results after adding an offset voltage to the default read voltage. The modified read voltage is the voltage used to perform a read operation when the charge hasn't yet settled to the steady state. The alternate read voltage, R3', can be reduced from a default read voltage (e.g., R3) by a pre-determined voltage amount 328. Although a reduced read voltage is illustrated in FIG. 3 for only one read level, R3, the other read levels, R1, R2, and/or others, can also be reduced when reading using a modified read voltage is implemented. Since at any given time a majority of memory cells have not been just programmed, and charge therein is settled to the steady state, it can be efficient for the default read voltage to be calibrated to the read voltage corresponding to charge settled to the steady state.

Beyond the transitory shifting of Vt due to initial charge settling after programming, the Vt of a memory cell can change, e.g., shift, over time due to a number of other mechanisms. For example, the charge storage node, e.g., floating gate, of the memory cell may lose charge over time. That is, charge may leak from the charge storage node. Such charge loss can cause the Vt of the cell to change, e.g., decrease. Additionally, as the memory cell undergoes programming and/or sensing operations over time, program disturb and/or read disturb mechanisms may cause the Vt of the cell to change, e.g., increase. Other mechanisms can also cause the Vt of the memory cell to change over time. These effects can be cumulative and may be accounted for in addition to charge settling considerations since a worn memory cell can be programmed resulting in multiple degradation modes occurring simultaneously.

In some instances, such a Vt change can alter the state of the memory cell. For example, if the memory cell were programmed to target state L2, e.g., data 00, charge loss could cause the Vt of the memory cell to decrease to a level less than R2, or possibly to a level within Vt 326-1 corresponding to state L1, e.g., data 01.

Accordingly, such a Vt change can result in erroneous data being sensed during a sensing operation performed on the memory cell using the sensing voltages illustrated in FIG. 3, e.g., read voltages R1, R2 and R3, and/or program verify voltages PV1, PV2, and PV3. For example, performing a sensing operation using the sensing voltages illustrated in FIG. 3 may result in a determination that the memory cell represents a state other than the target state to which the cell was programmed. For instance, a sensing operation performed on a memory cell that was programmed to target state L2 and has undergone charge loss may determine that the cell represents state L1, if read voltage R2 is used in the sensing operation. That is, using read voltage R2 may result in a cell programmed to store data 00 being erroneously sensed as storing data 01.

As such, sensing voltages used during sensing operations performed before the Vt change occurs, e.g., the read voltages illustrated in FIG. 3, may no longer provide accurate and/or reliable sensing of memory cells that have undergone a Vt change, e.g., charge loss. However, adjusting, e.g., changing, the sensing voltages, e.g., to sensing voltages other than those illustrated in FIG. 3, may track and/or compensate for such a Vt change, thereby providing accurate and/or reliable sensing of the memory cells that have undergone the Vt change, as will be further described herein.

Figure 4:
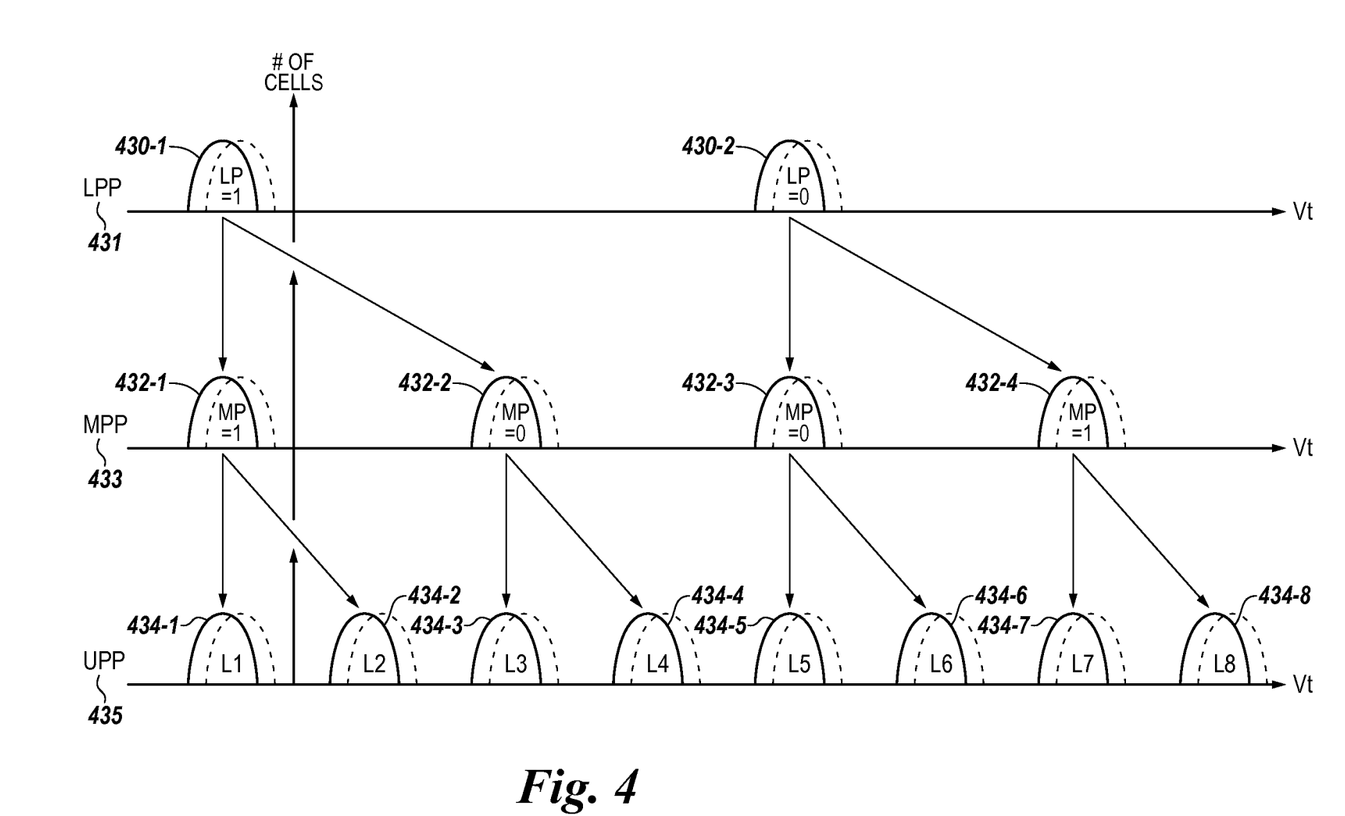
FIG. 4 illustrates a change in read voltage threshold distributions for programmed states associated with multiple pages based on a length of time after programming in accordance with a number of embodiments of the present disclosure.

FIG. 4 illustrates a change in read voltage threshold distributions for programmed states associated with multiple pages based on a length of time after programming in accordance with a number of embodiments of the present disclosure. The apparatuses and methods described thus far can be applied to single digit and multi-digit memory cells. In the example illustrated in FIG. 4, the memory cells are 3-bit memory cells with each cell being programmable to one of eight data states (e.g., L1 to L8) each indicating a different 3-bit stored bit pattern (e.g., 111, 011, 001, 101, 100, 000, 010, and 110). In a number of embodiments, each of the bits in the 3-bit stored bit pattern corresponds to a different page of data. For instance, the least significant bit (LSB) can contribute to a first page of data (e.g., a lower page of data), the middle bit can contribute to a second page of data (e.g., a middle page of data), and the most significant bit (MSB) can contribute to a third page of data (e.g., an upper page of data). As such, a page of cells can store three pages of data, in this example.

However, embodiments are not limited to multilevel memory cells storing three bits of data. For instance, a number of embodiments can include memory cells configured to store more or fewer than three bits of data and/or a fractional number of bits of data. Also, embodiments are not limited to the particular bit values assigned to the data states L1 to L8.

The diagram shown in FIG. 4 illustrates threshold voltage (Vt) distributions of a number of cells after a lower page programming (LPP) process 431, a middle page programming (MPP) process 433, and an upper page programming (UPP) process 435. NAND flash memory cells can be erased prior to having new data programmed thereto.

As part of the LPP process 431, the Vt of the memory cells are adjusted (e.g., via programming pulses applied to a selected word line) to one of two levels represented by Vt distributions 430-1 and 430-2. The voltage levels are represented by Vt distributions, which can reflect a statistical average Vt level of cells programmed to a particular level. In this example, cells whose lower page is to store a bit value of "1" (e.g., LP=1) are programmed to distribution 430-1 during LPP process 431, and cells whose lower page is to store a bit value of "0" (e.g., LP=0) are programmed to distribution 430-2 during LPP process 431.

As part of the MPP process 433, the Vt of the memory cells are adjusted to one of four levels represented by Vt distributions 432-1, 432-2, 432-3, and 432-4. In this example, cells whose middle page is to store a bit value of "1" (e.g., MP=1) are programmed to one of distributions 432-2 and 432-3 during MPP process 433, and cells whose middle page is to store a bit value of "0" (e.g., MP=0) are programmed to one of distributions 432-1 and 432-4 during MPP process 433.

As part of the UPP process 435, the Vt of the memory cells are adjusted to one of eight levels represented by Vt distributions 434-1 to 434-8, which correspond to data states L1 to L8, respectively, with each one of data states L1 to L8 indicating a different 3-bit stored bit pattern. In this example, cells programmed to data state L1 store data "111," cells programmed to data state L2 store data "011," cells programmed to data state L3 store data "001," cells programmed to data state L4 store data "101," cells programmed to data state L5 store data "100," cells programmed to data state L6 store data "000," cells programmed to data state L7 store data "010," and cells programmed to data state L8 store data "110."

As is shown in FIG. 4 by the solid line and corresponding dotted line voltage distributions, each of the lower page, middle page and upper page voltage distributions are subject to the Vt shifting caused by charge settling, as described in detail with respect to FIG. 3. Although not necessarily shown at scale in FIG. 4, it can be observed that due to the increasingly closer proximity of voltage distributions to one another in middle and upper pages with respect to lower pages, accounting for the transitory Vt shifts for some time after programming becomes increasingly important so as to avoid state mis-identification and associated error determinations.

Figure 5:
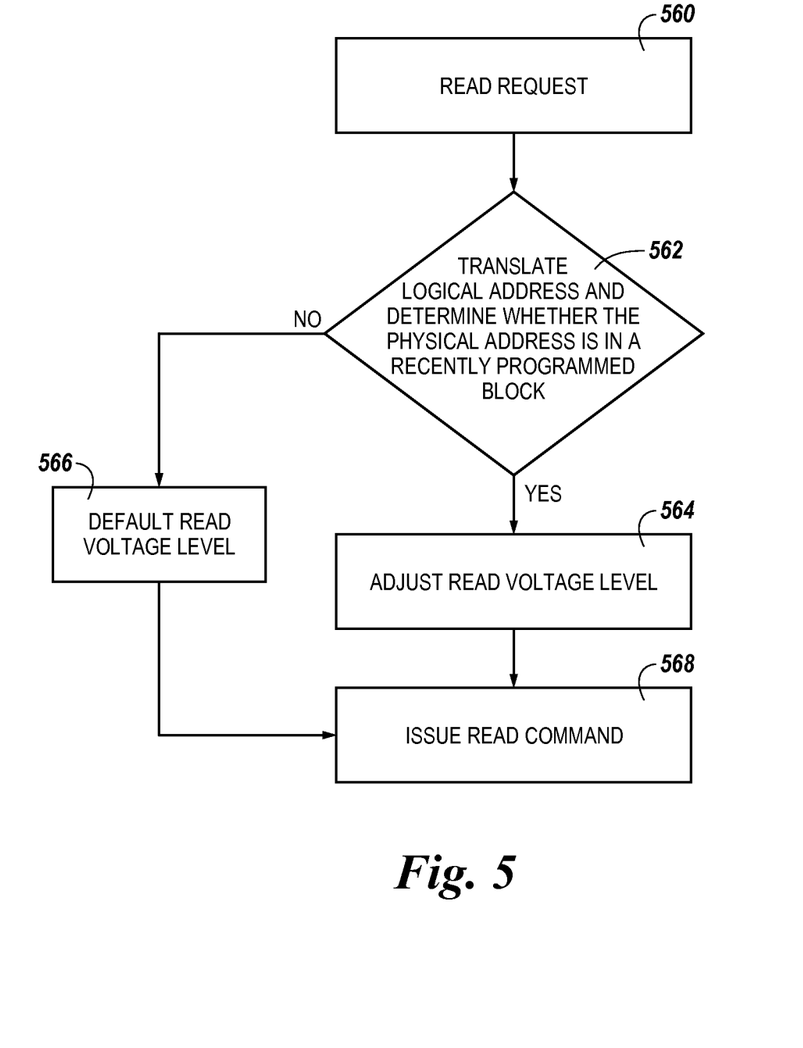
FIG. 5 is a flow chart illustrating a method of operating memory in accordance with a number of embodiments of the present disclosure.

FIG. 5 is a flow chart illustrating a method of operating memory in accordance with a number of embodiments of the present disclosure. At 560 a read request can be received (e.g., from a host, such as host 102 illustrated in FIG. 1). At 562, an address associated with the read request can be translated to a physical address and a determination can be made as to whether the physical address is in a block that was programmed within a particular length of time period (e.g., within a predetermined time period and/or within a threshold number of pages from a last written page of the block). As described with respect to FIG. 1, such determination can be performed as part of the address translation process (e.g., by logical-to-physical translation circuitry 112 illustrated in FIG. 1), which can be advantageous in reducing latency and overhead associated with other methods of determining whether memory cell charge has settled to a steady state base on time proximity between a read operation and a last write operation.

If the physical address to be read is within a threshold number of pages of a last written page, then a read voltage can be adjusted as indicated at 564. Adjusting the read voltage can include selecting one of a plurality of adjusted read signal levels (e.g., preset adjusted read signal levels) or adding an offset to a default read voltage, for example. However, if the physical address is not within a threshold number of pages (e.g., a proximity threshold) from a last written page, then a default read signal level corresponding to a steady state memory cell charge can be used as indicated at 566. At 568, a read command can be issued to a memory device that includes the physical address.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory array; and
   a controller coupled to the memory array, wherein the controller is configured to adjust a read voltage used to access a portion of the memory array based on a length of time since a last WRITE operation to the portion and based on location of the portion in the memory array in relation to a most recent programmed portion.

2. The apparatus of claim 1, wherein the controller is configured to adjust the read voltage used to access the portion of the memory array based on the portion of the memory array being included in a predetermined quantity of portions programmed prior to a most recent programmed portion.

3. The apparatus of claim 1, wherein the controller is configured to not adjust the read voltage used to access the portion of the memory array after a time period since the last WRITE operation to the portion.

4. The apparatus of claim 1, wherein the controller is configured to adjust the read voltage used to access the portion of the memory array based on a length of time since the last WRITE operation to the portion and based on location of the portion in the memory array.

5. The apparatus of claim 4, wherein the controller is configured to adjust the read voltage used to access the portion of the memory array based on a length of time since the last WRITE operation to the portion and based on location of the portion in the memory array being one of an upper page or a lower page.

6. The apparatus of claim 4, wherein the controller is configured to adjust the read voltage used to access the portion of the memory array based on a length of time since the last WRITE operation to the portion and location of the portion in the memory array being one of an even page or an odd page.

7. The apparatus of claim 1, wherein the controller is configured to decrease the read voltage used to access the portion of the memory array based on a length of time since a last WRITE operation to the portion.

8. The apparatus of claim 1, wherein the controller is configured to decrease the read voltage used to access the portion of the memory array for a time period following a last WRITE operation to the portion.

9. The apparatus of claim 1, wherein the controller is configured to decrease the read voltage used to access the portion of the memory array for a time period within the range of a few mS following a last WRITE operation to the portion.

10. The apparatus of claim 1, wherein the controller is configured to decrease the read voltage used to access the portion of the memory array for a time period following a last WRITE operation to the portion, the time period corresponding to a period for which a memory cell charge associated with a WRITE operation has not settled to a steady state.

11. The apparatus of claim 1, wherein the controller is configured to decrease the read voltage used to access the portion of the memory for which the memory cell charge associated with the WRITE operation includes a voltage associated with quick charge gain (QGC) that decays over a period of time to the steady state.

12. The apparatus of claim 11, wherein the controller is configured to:
decrease the read voltage when accessing a portion of a memory for which a memory cell charge associated with a WRITE operation has not settled to a steady state; and
not decrease the read voltage when accessing a portion of the memory for which a memory cell charge associated with a WRITE operation has settled to a steady state.

13. An apparatus, comprising:
a memory array; and
a controller coupled to the memory array, wherein the controller is configured to:
track a portion of a memory to which data was written within a length of time;
adjust a read voltage when accessing the portion of the memory to which data was written within the length of time based on location of the portion in the memory array; and
not adjust the read voltage when accessing a portion of the memory other than the portion of the memory to which data was written within the length of time based on location of the other portion in the memory array.

14. The apparatus of claim 13, wherein the controller is configured to adjust the read voltage to include an offset when accessing the portion of the memory to which data was written within the length of time.

15. The apparatus of claim 13, wherein the controller is configured to include an offset that reduces the read voltage when accessing the portion of the memory to which data was written within the length of time.

16. The apparatus of claim 13, wherein the controller is configured to not adjust the read voltage to include an offset when accessing a portion of the memory other than the portion of the memory to which data was written within the length of time.

17. The apparatus of claim 13, wherein the controller is configured to track one or more last written pages of the memory.

18. The apparatus of claim 13, wherein the controller is configured to determine that a page of the memory to be accessed for a READ command is within the one or more last written pages of the memory.

19. The apparatus of claim 18, wherein the controller is configured to determine that a page of the memory to be accessed for the READ command is within a plurality of the last written pages of the memory.

20. The apparatus of claim 13, wherein the controller is configured to add an offset to the read voltage before issuing a READ command to the portion of a memory to which data was written within the length of time.

21. The apparatus of claim 13, wherein the memory is a charge trap Flash NAND memory.

22. An apparatus, comprising:
a memory array; and
a controller coupled to the memory array, wherein the controller is configured to:
record a last written page physical address associated with a WRITE operation;
translate a logical block address to a physical address;
compare a physical address associated with a READ operation with the last written page physical address associated with a WRITE operation; and
use an offset to the read voltage when the physical address associated with the READ operation is within a predetermined number of pages of the last written page physical address, wherein the controller is configured to factor a quick charge gain (QCG) voltage into a read window budget.

23. The apparatus of claim 22, wherein the offset to the read voltage is a pre-characterized fixed value.

24. The apparatus of claim 22, wherein the offset to the read voltage is characterized dynamically based on identifying information associated with a memory device during memory device idle time.

25. The apparatus of claim 24, wherein the offset to the read voltage is characterized dynamically based on logical unit number (LUN) used to identify Small Computer System Interface (SCSI) devices.

26. A method comprising:
tracking, with a controller, a portion of a memory to which data was written;
adjusting, with the controller, a read voltage when accessing the portion of the memory to which data was written within a predetermined time period based on location of the portion in a memory array; and
not adjusting the read voltage when accessing a portion of the memory other than the portion of the memory to which data was written within the predetermined time period based on location of the other portion in the memory array.

27. The method of claim 26, wherein adjusting the read voltage includes adding an offset to the read voltage when accessing the portion of the memory to which data was written within the predetermined time period.

28. The method of claim 26, wherein not adjusting the read voltage includes not adding an offset to the read voltage when accessing a portion of the memory other than the portion of the memory to which data was written within the predetermined time period.

29. The method of claim 26, wherein:
tracking the portion of the memory to which data was written within the predetermined time period includes tracking one or more last written pages of the memory;
adjusting the read voltage when accessing the portion of the memory to which data was written within the predetermined time period includes adjusting the read voltage when the portion of the memory is within a predetermined number of pages of the one or more last written pages; and
not adjusting the read voltage when accessing the portion of the memory other than the portion of the memory to which data was written within the predetermined time period includes not adjusting the read voltage when the portion of the memory is not within the predetermined number of pages of the one or more last written pages.

30. The method of claim 29, wherein tracking the portion of the memory to which data was written within the predetermined time period includes determining that a page of the memory to be accessed for a READ command is within the one or more last written pages of the memory.

31. The method of claim 30, wherein determining that the page of the memory to be accessed for the READ command is within the one or more last written pages of the memory includes that the page of the memory to be accessed for the READ command is within ten (10) last written pages of the memory.

32. The method of claim 26, wherein adjusting the read voltage includes adding, by the controller, an offset to the read voltage before issuing a READ command to the portion of a memory to which data was written within the predetermined time period.

33. The method of claim 26, wherein the memory is a charge-trapping flash NAND memory.

34. The method of claim 26, wherein tracking the portion of a memory to which data was written within the predetermined time period includes:
recording a time stamp of a most recent WRITE operation to the portion of the memory; and
comparing a time of a READ operation to the time stamp of the most recent WRITE operation to the portion of a memory to determine whether data was written within the predetermined time period to the portion of the memory.

35. A method comprising:
adjusting, with a controller, a read voltage when accessing a portion of a memory for which a memory cell charge associated with a WRITE operation has not settled to a steady state, wherein adjusting the read voltage includes adding an offset to the read voltage determined based on location involved in a READ operation; and
not adjusting the read voltage when accessing a portion of the memory for which a memory cell charge associated with a WRITE operation has settled to a steady state.

36. The method of claim 35, wherein adjusting the read voltage includes adding an offset to the read voltage, the offset being such that the read voltage is smaller for accessing the portion of the memory for which the memory cell charge associated with the WRITE operation has not settled to a steady state relative to the read voltage for accessing the portion of the memory for which the memory cell charge associated with the WRITE operation has settled to a steady state.

37. The method of claim 36, wherein the offset is pre-characterized so as not to result in significant raw bit error rate (RBER) degradation for the memory cell charge associated with the WRITE operation that has settled to a steady state.

38. The method of claim 37, wherein the offset is non-zero in a range of tens of mV.

39. The method of claim 36, wherein the offset is non-zero in a range of hundreds of mV.

40. The method of claim 36, wherein the offset is determined based on whether a READ operation involves a lower page odd, lower page even, upper page odd, or upper page even portion of the memory.

41. The method of claim 36, wherein the offset is a same offset regardless of whether a READ operation involves a lower page odd, lower page even, upper page odd, or upper page even portion of the memory.

42. The method of claim 36, wherein the offset is configured to counter quick charge gain (QCG) in part associated with NAND charge trap Flash memory cells of the memory.

* * * * *